(12) United States Patent
Draxelmayr et al.

(10) Patent No.: US 7,126,511 B2
(45) Date of Patent: Oct. 24, 2006

(54) CIRCUIT ARRANGEMENT FOR THE DELAY ADJUSTMENT OF ANALOG-TO-DIGITAL CONVERTERS OPERATING IN A TEMPORALLY OFFSET MANNER

(75) Inventors: Dieter Draxelmayr, Villach (AT); Franz Kuttner, St.-Ulrich (AT); Christian Vogel, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/064,918

(22) Filed: Feb. 24, 2005

(65) Prior Publication Data
US 2005/0190089 A1 Sep. 1, 2005

(30) Foreign Application Priority Data
Feb. 27, 2004 (DE) .................... 10 2004 009 612

(51) Int. Cl.
*H03M 1/00* (2006.01)
(52) U.S. Cl. .................. 341/136; 341/155; 341/341; 341/118
(58) Field of Classification Search .......... 341/155, 341/136, 118, 169, 120, 141, 172, 159; 327/532
See application file for complete search history.

(56) References Cited

U.S. PATENT DOCUMENTS

| 3,525,991 | A | * | 8/1970 | Kohler | 341/169 |
| 3,701,059 | A | | 10/1972 | Nyswander | |
| 4,114,117 | A | | 9/1978 | Ford | |
| 4,345,241 | A | * | 8/1982 | Takeuchi et al. | 341/118 |
| 4,633,226 | A | * | 12/1986 | Black, Jr. | 341/159 |
| 4,763,105 | A | * | 8/1988 | Jenq | 341/120 |
| 4,968,988 | A | * | 11/1990 | Miki et al. | 341/141 |
| 5,221,926 | A | * | 6/1993 | Jackson | 341/118 |
| 5,294,926 | A | | 3/1994 | Corcoran | |
| 5,563,596 | A | * | 10/1996 | Snyder et al. | 341/131 |
| 5,585,796 | A | * | 12/1996 | Svensson et al. | 341/155 |

(Continued)

OTHER PUBLICATIONS

German Office Action dated Oct. 13, 2004.

*Primary Examiner*—Jean Bruner Jeanglaude
(74) *Attorney, Agent, or Firm*—Jenkins, Wilson, Taylor & Hunt, P.A.

(57) ABSTRACT

Circuit arrangement (1) for the delay adjustment of analog-to-digital converters (4-1, . . . 4-N, 504) operating in a temporally offset manner, having at least two analog-to-digital converters (4-1, . . . 4-N, 504) each having a signal path, which receive an analog signal (VI) present at an input (2) of the circuit arrangement (1) and in each case convert it into a digital intermediate signal (Z1, . . . ZN), the analog-to-digital converters (4-1, . . . 4-N, 504) in each case being clocked by clock signals (CLK1, . . . CLKN) which have a predetermined time offset with respect to one another; having a logic circuit (7), which interconnects the digital intermediate signals (Z1, . . . ZN) for the purpose of generating a digital output signal (ZD) of the circuit arrangement (1); it being possible to set the bandwidth of the signal paths of the analog-to-digital converters (4-1, . . . 4-N, 504) in each case in such a way that a deviation of the clock signal (CLK1, . . . CLKN) from the predetermined time offset for the respective analog-to-digital converter (4-1, . . . 4-N, 504) is compensated for by a change in the bandwidth of at least signal path.

20 Claims, 7 Drawing Sheets

U.S. PATENT DOCUMENTS 5,621,409 A    4/1997   Cotter et al.
5,973,633 A *  10/1999  Hester ........................ 341/172
6,476,749 B1   11/2002  Yeap et al.
6,522,282 B1   2/2003   Elbornsson
6,552,676 B1   4/2003   Bjorksten et al.
6,577,180 B1 * 6/2003   Liu ............................ 327/532

* cited by examiner

CIRCUIT ARRANGEMENT FOR THE DELAY ADJUSTMENT OF ANALOG-TO-DIGITAL CONVERTERS OPERATING IN A TEMPORALLY OFFSET MANNER

Circuit arrangement for the delay adjustment of analog-to-digital converters operating in a temporally offset manner.

TECHNICAL FIELD

The invention relates to a circuit arrangement for the delay adjustment of analog-to-digital converters operating in a temporally offset manner, which are arranged in particular in arrays.

BACKGROUND ART

Arrays of analog-to-digital converters operating in parallel comprise a plurality of analog-to-digital converters which digitize an analog signal in parallel, but with a certain temporal offset. The individual digital signals are then recombined by means of a multiplexer, thereby effectively achieving a higher sampling rate than that of the individual analog-to-digital converters. Converter arrays of this type are also called TIADCs (=time interleaved analog-to-digital converters).

In the simplest case of a TIADC, two analog-to-digital converters are connected in parallel, alternately sample a common analog input signal and digitize it. As a result, the sampling or conversion rate of the overall system appears doubled compared with the sampling rate of the individual analog-to-digital converters.

In the more general case, by increasing the number of analog-to-digital converters operating in parallel or by increasing the number of channels, in the case of N analog-to-digital converters it is possible to increase the effective sampling rate of the converter array to N times the sampling rate of an individual analog-to-digital converter. In the case of such arrays, however, there is the difficulty that any type of inequality among the individual converters leads to conversion errors. By way of example, different offset values of the various analog-to-digital converters lead to disturbing sounds at frequencies comprising whole divisors of the sampling frequency. Different nonlinearities of the channels, differences in gain, deviations from the ideal sampling instant or a different bandwidth of the analog-to-digital converters also lead to undesirable disturbances.

The text below discusses in particular the adjustment of the individual sampling instants of the respective analog-to-digital converters in a TIADC.

FIG. 1 shows a converter array or TIADC according to the prior art.

N analog-to-digital converters A/D1, A/D2, . . . A/DN are provided, each having an analog input E1, E2, . . . EN, a digital output A1, A2, . . . AN and an input C1, C2, . . . CN for a respective clock signal CLK1', CLK2', . . . CLKN'. A common analog input signal VIN is applied to the analog inputs E1, E2 . . . EN. The analog-to-digital converters A/D1, A/D2, A/DN in each case supply digital intermediate signals Z1, Z2, ZN at their outputs A1, A2, AN, which intermediate signals are switched through as digital output signal ZD of the TIADC by a multiplexer MUX connected downstream.

A clock generator CLKG generates a global clock signal CLK, which is passed to a Delay Locked Loop DLL, which generates therefrom an N phase clock or N clock signals CLK1, CLK2 . . . CLKN which in each case have the same clock period T as the global clock signal CLK but are in each case delayed by a time offset of $T/N=\Delta T$.

These clock signals CLK1, CLK2, CLKn are in each case passed via a tunable delay element V1, V2, VN, by way of example in each case a Vernier element, as tuned clock signals CLK1', CLK2', CLKN' to the inputs C1, C2, . . . CN of the individual analog-to-digital converters A/D1, A/D2, A/DN. The tunable delay elements V1, V2, V3 are set in such a way that clock signals CLK1, CLK2, CLKN that deviate from the ideal clock are delayed to a greater or lesser extent in order to compensate for the error.

As is described in K. Poulton et al.: "A 4GS/s 8b ADC in 0.35 m CMOS", ISSCC 2002, pages 166–167, the optimum sampling instants or the optimum time offsets which are determined by the respective clock signals CLK1', CLK2', CLKN' may be set by applying a pulsed wave as input signal VIN and Fourier analysis of the digital intermediate signals Z1, Z2, ZN. What is disadvantageous about the prior art solution for delay adjustment is, in particular, that the variable delay elements V1, V2, . . . VN have to be kept available N-fold and have to be individually drivable. A considerable additional outlay on circuitry is therefore required. Moreover, the tunable delay elements represent additional noise sources and may cause shallower clock edges. This leads to an increased timing jitter and reduces the performance of the converter array according to the prior art.

Anderson et al. "Verification of a Blind Mismatch Error Equalization Method for Randomly Interleaved ADCs using a 2.5 V/12b/30 MSs PSAADC", ESSCIRC 2003, pages 473–476, describes a method for attenuating disturbance effects due to misadjusted analog-to-digital converters in TIADCs. According to this method, a further M additional analog-to-digital converters are provided as well as the N parallel analog-to-digital converters. Since the entire converter array is intended to yield a sampling rate that is N times higher than that of each individual analog-to-digital converter, the M additional analog-to-digital converters are used to achieve randomization. For a converter cycle, N converters are randomly selected from the N plus M converters and their conversion result is switched through as digital output signal of the converter array by the multiplexer. This results in a random distribution, inter alia of the offset errors. This method also requires a huge additional outlay on circuitry since additional analog-to-digital converters have to be kept available.

SUMMARY OF THE INVENTION

Therefore, it is an object of the present invention to provide a circuit arrangement for the delay adjustment of analog-to-digital converters operating in a temporally offset manner which necessitates a low outlay on circuitry, can readily be integrated into existing converter arrays, operates reliably and saves power.

According to the invention, this object is achieved by means of a circuit arrangement having the features presently disclosed herein.

Accordingly, a circuit arrangement for the delay adjustment of analog-to-digital converters operating in a temporally offset manner is provided, which has at least two analog-to-digital converters each having a signal path, the analog-to-digital converters receiving an analog input signal present at an input of the circuit arrangement and in each case converting it into a digital intermediate signal. In this case, the analog-to-digital converters are in each case clocked by clock signals which have a predetermined time offset with respect to one another. Furthermore, the circuit arrangement has a logic circuit, which interconnects the digital intermediate signals for the purpose of generating a digital output signal of the circuit arrangement. In this case, the bandwidth of the signal paths of the analog-to-digital converters can in each case be set in such a way that a deviation of the clock signal from the predetermined time offset for the respective analog-to-digital converter is compensated for by a change in the bandwidth of at least one signal path.

The idea on which the present invention is based consists in the fact that a change in the bandwidth of a signal path that acts like a filter is equivalent to a change in the phase response. Therefore, according to the invention, an erroneous offset of the sampling instants of the analog-to-digital converters, which in each case depend on the clock signals, can be compensated for by a change in the bandwidth. Filter-like arrangements, which are generally present in each signal path of the analog-to-digital converter channels, can be used for correction to the predetermined optimum time offset. This means that, according to the invention, no additional circuitry has to be kept available, as a result of which the circuit arrangement according to the invention is particularly effective at saving power and can be implemented simply in terms of circuit technology. Moreover, the circuit arrangement according to the invention makes it possible to dispense with additional arrangements of delay lines or tunable delay elements, as a result of which these additional noise sources are no longer present. This results in an increased signal quality and performance of the converter array.

Preferably, the logic circuit has a multiplexer, which successively switches through the digital intermediate signals for the purpose of generating a digital output signal of the circuit arrangement. A multiplexer constitutes a simplest possible realization for the interconnection of the intermediate signals.

In an advantageous refinement of the circuit arrangement according to the invention, the analog-to-digital converters in each case have an input and an output and a means for bandwidth setting having an input and an output is provided on the input side in the signal path of at least one of the analog-to-digital converters, it being possible to set the bandwidth of the respective means. Since the bandwidth setting occurs in the signal path, disturbances are practically precluded.

Preferably, the means for bandwidth setting is a sample and hold element or a filter. Since sample and hold elements are generally provided at the input side of analog-to-digital converters, setting the bandwidth of these sample and hold elements is particularly advantageous since no additional circuit elements are required. However, it is also possible for additional filters, the bandwidth of which can be set, to be inserted into the respective signal paths.

In a preferred embodiment, the means for bandwidth setting has a variable resistor, which is connected to the input of the means in the signal path, and preferably a variable capacitor, which is connected between the output of the means and a first reference potential. This embodiment essentially represents a low pass filter in the respective signal path, which is easy to realize and above all the bandwidth of which can be tuned by varying the resistance and/or capacitance of the capacitor.

In a preferred development of the circuit arrangement according to the invention, at least one analog-to-digital converter operates according to the charge redistribution method (charge redistribution analog-to-digital converter) and has a comparator, which is supplied with a bias current from a bias current source, having at least one input and an output. In the preferred development, a plurality of binary weighted capacitors are provided, which are connected in parallel between the input of the comparator and a respective controllable switch. In this case, the controllable switches in each case switch the analog input signal, a first reference potential or a second reference potential to the respective capacitor. Furthermore, a transistor having a gate terminal and a controllable path that has a resistance is provided, the gate terminal being coupled to a switching signal and the controllable path being connected between the input and the output of the comparator. In this case, the bandwidth of the analog-to-digital converter can be set by varying the bias current. Preferably, at least one switch is provided between the gate terminal of the transistor and the switching potential, which switch switches either the switching potential or a control potential to the gate terminal depending on a control signal.

The use of analog-to-digital converters which operate according to the charge redistribution method is particularly advantageous because the bandwidth of the respective analog-to-digital converters themselves can be set by varying the bias current at the corresponding comparators. By applying a control potential to the gate terminal of the transistor, the resistance of the controllable path of the transistor can also be set and makes it possible to effect a change in the bandwidth. Moreover, corresponding analog-to-digital converters are extremely effective at saving power since practically no dissipative components are provided. Since the analog-to-digital converters are provided in a TIADC or array, a slower dynamic response or lower sampling rate compared with analog-to-digital converters which operate by the parallel method, for example, does not have a disadvantageous effect.

Further advantageous refinements and developments of the invention are the subject matter of the subclaims and of the description with reference to the drawings.

BRIEF DESCRIPTION OF THE DRAWINGS

The invention is explained in more detail below with reference to the schematic figures, in which.

DETAILED DESCRIPTION OF THE INVENTION

Identical or functionally identical elements are provided with the same reference symbols in the figures.

Figure 1:
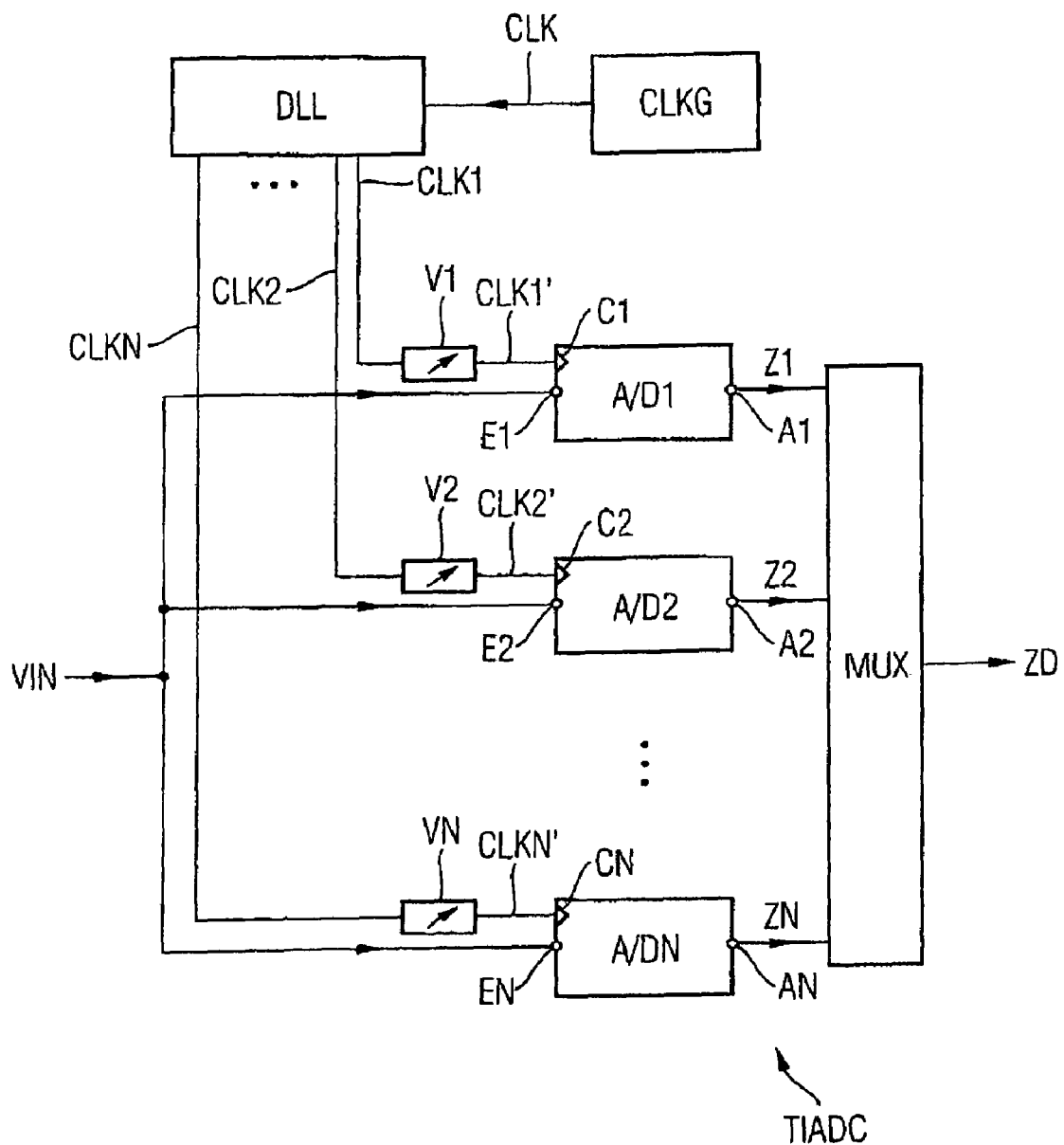
FIG. 1 shows a converter array according to the prior art.
Figure 2:
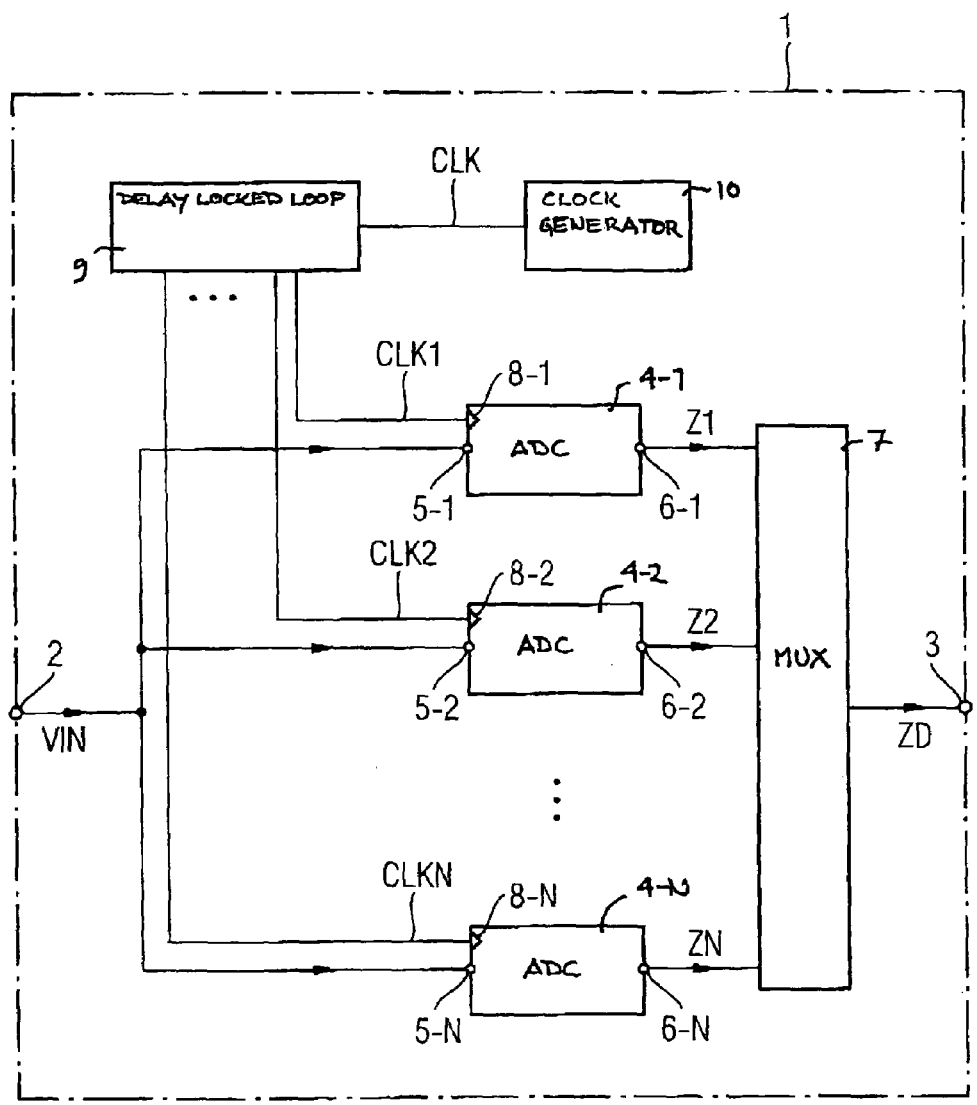
FIG. 2 shows a block diagram of a circuit arrangement according to the invention.

FIG. 2 shows a block diagram of a circuit arrangement 1 according to the invention having an input 2 for coupling in an analog input signal VIN and an output 3 for outputting a digital output signal ZD. A plurality of analog-to-digital converters 4-1, 4-2, . . . 4-N are provided, each having an input 5-1, 5-2, . . . 5-N connected to the input 2 of the circuit arrangement 1. The analog-to-digital converters 4-1, 4-2, . . . 4-N furthermore each have a digital output 6-1, 6-2, . . . 6-N, at which digital intermediate signals Z1, Z2 . . . ZN can be tapped off.

The digital intermediate signals Z1, Z2, . . . ZN are passed to an N-fold multiplexer 7, which successively switches through the intermediate signals Z1, Z2, ZN as the digital output signal ZD to the output 3 of the circuit arrangement 1.

In addition, the analog-to-digital converters 4-1, 4-2, . . . 4-N each have a clock input 8-1, 8-2, . . . 8-N, to which a clock signal CLK1, CLK2, . . . CLKN is respectively passed. The clock signals CLK1, CLK2, . . . CLKN are generated by a delay locked loop 9, which generates a multiphase clock from a global clock signal CLK generated by a clock generator 10 and outputs this in the form of the clock signals CLK1, CLK2, . . . CLKN.

Given a clock period T of the global clock signal CLK, the clock signals CLK1, CLK2, CLKN are ideally offset from one another by $\Delta T=T/n$ in each case. The sampling operation of the individual analog-to-digital converters 4-1, 4-2, . . . 4-N is defined by the respective clock signals CLK1, CLK2, . . . CLKN.

Since the same analog input signal VIN is present at all the inputs 5-1, 5-2, . . . 5-N of the analog-to-digital converters 4-1, 4-2, . . . 4-N, it is effectively sampled at N times the frequency of the global clock signal CLK. This ideal clock offset may not always be ensured, however, on account of manufacturing fluctuations. According to the invention, a deviation of the respective clock signal CLK1, CLK2, . . . CLKN from the predetermined time offset m $\Delta T$ with respect to the global clock signal CLK, where m is a natural number, is compensated for by a change in the bandwidth of the signal paths of the analog-to-digital converter channels.

The relationship between time offset and phase offset or the bandwidth of a signal path can be described with reference to an RC low-pass filter. RC-like elements are generally contained in sample and hold elements of analog-to-digital converters, as is described further below. The phase of a low-pass-filtered signal is:

$$\tan \phi = -\omega RC,$$

which, for small arguments of the tangent, is approximately equal to $\phi=-\omega RC$. If a plane wave ($\propto \cos \omega t$) is considered as the output signal of an RC element of this type, the following is obtained given a normalized amplitude:

$$\cos(-\omega t + \phi) = \cos[\omega \cdot (t - RC)].$$

Consequently, a change in the bandwidth by varying R or C is equivalent to a phase offset or time offset. This is utilized according to the invention in the signal paths of the analog-to-digital converter channels of the converter array.

Figure 3:
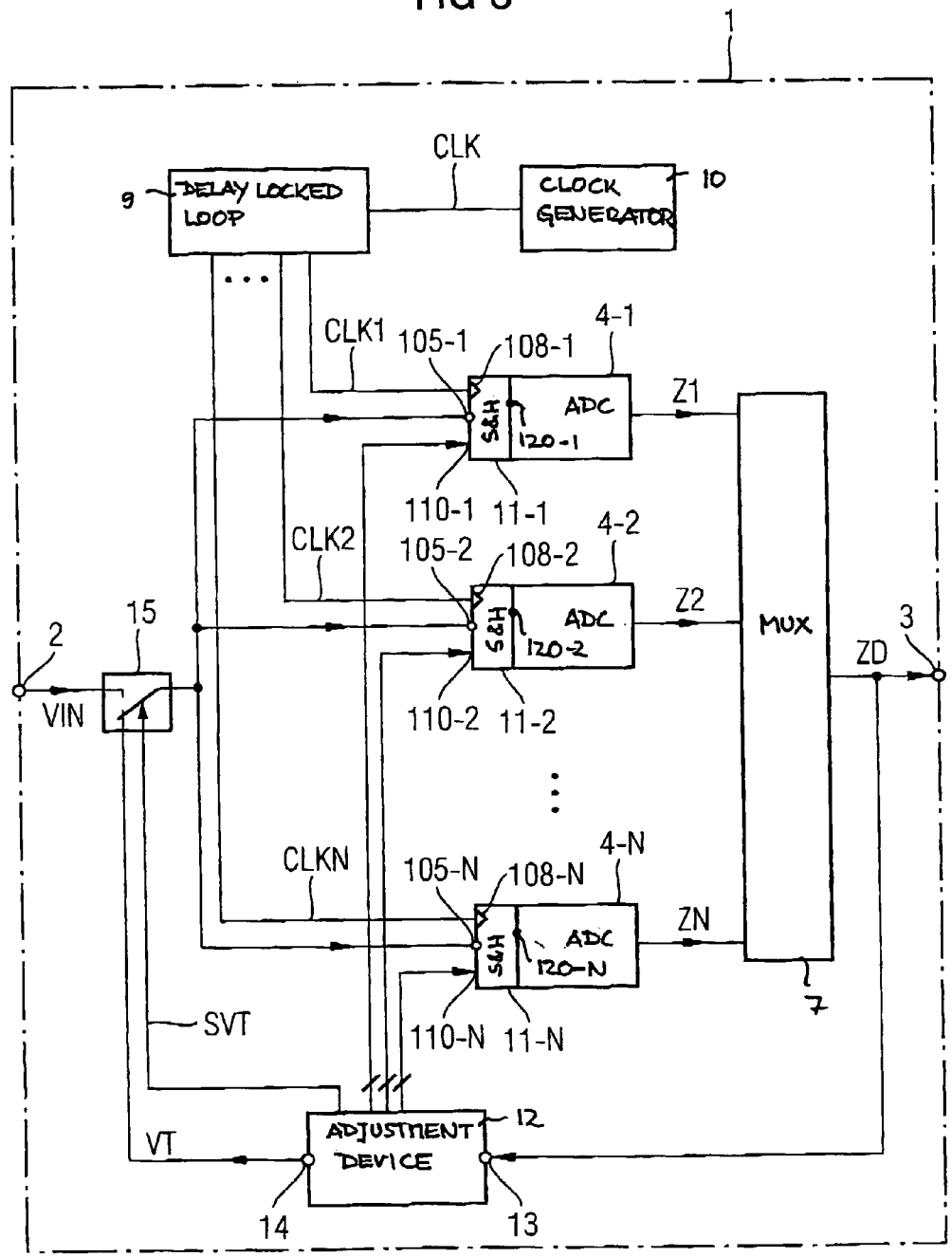
FIG. 3 shows a block diagram of a preferred embodiment of the invention.

FIG. 3 shows a preferred embodiment of the circuit arrangement 1 according to the invention, which, in particular, exploits the fact that the analog-to-digital converters used in each case have a sample and hold element, the bandwidth of which can be set.

The preferred embodiment of the circuit arrangement 1 according to the invention essentially has the same components as shown in FIG. 2. Furthermore, the analog-to-digital converters 4-1, 4-2, . . . 4-N in each case have a sample and hold element 11-1, 11-2, . . . 11-N, which is in each case provided on the input side and serves to keep constant the input voltage or the analog input signal VIN through analog storage during the conversion process. Possible preferred embodiments of sample and hold elements 11-1, 11-2, . . . 11-N according to the invention are described further below.

The sample and hold elements 11-1, 11-2, 11-N of the respective analog-to-digital converters 4-1, 4-2, 4-N in each case have inputs 108-1, 108-2, . . . 108-N for the respective clock signals CLKN, and also in each case an input 105-1, 105-2, 105-N for receiving the analog input signal VIN and in each case one or more control terminals 110-1, 110-2, . . . 110-N, which are illustrated as simple lines in the figure. The sample and hold elements 11-1, 11-2, . . . 11-N pass through an input signal VIN that has been kept constant via a respective output 120-1, 120-2, . . . 120-N for further processing or conversion at converter stages of the analog-to-digital converters 4-1, 4-2, . . . 4-N.

An adjustment device 12 is furthermore provided, having an input 13, to which the digital output signal ZD of the circuit arrangement 1 according to the invention is passed. The adjustment device 12 controls a changeover device 15, which, depending on a test control signal SVT, switches either the analog input signal VIN or an analog test signal VT to the parallel-connected analog-to-digital converters 4-1, . . . 4-N or the analog-to-digital converter channels. The analog test signal VT is supplied by the adjustment device 12 at an output 14.

The adjustment device 12 is connected via control lines to the control inputs 110-1, 110-2, . . . 110-N of the sample and hold elements 11-1, 11-2, . . . 11-N. the respective bandwidth of the sample and hold elements 11-1, 11-2, . . . 11-N is set by means of control signals generated by the adjustment device 12.

The circuit arrangement 1 according to the invention operates in the manner described in FIG. 2. The analog-to-digital converters 4-1, 4-2, . . . 4-N operate in a temporally offset manner and supply corresponding digital intermediate signals Z1, Z2, . . . ZN to the multiplexer 7, which combines the latter to form the digital output signal ZD of the converter arrangement 1 or the converter array. Since the sampling instants, which depend on the clock signal CLK1, CLK2, . . . CLKN, generally deviate from the ideal value or ideal time offset, which is $\Delta T=T/n$, the adjustment device controls the bandwidth of the signal paths of the analog-to-digital converters 4-1, 4-2, . . . 4-N until a practically ideal digital output signal ZD is attained.

For this purpose, the adjustment device 12, via the changeover device 15, by way of example, applies a sinusoidal test signal VT to the input 2 of the circuit arrangement 1 and simultaneously analyses the converter result of the converter array or the digital output signal ZD by Fourier analysis and sets the bandwidth of the sample and hold elements 11-1, 11-2, . . . 11-N such that only the frequency component of the analog test signal VT contributes to the digital output signal ZD, that is to say an optimum adjustment takes place. Consequently, a deviation of the respective clock signal CLK1, CLK2, . . . CLKN from the predetermined optimum time offset m·$\Delta T$ is compensated for by a bandwidth tuning of the signal paths of the individual analog-to-digital converter channels.

Other adjustment methods are also possible. By way of example, the adjustment device 12 can mix a pilot test signal VT into the analog input signal VIN directly and whilst bypassing a changeover device 15, the pilot test signal lying in a frequency range where no parts of the analog input signal VIN to be converted are present. An adjustment of the delay times for the individual channels is thus possible even in converter operation.

A description is given below of some preferred embodiments of sample and hold elements that serve as means for setting the bandwidth of the signal paths.

Figure 4:
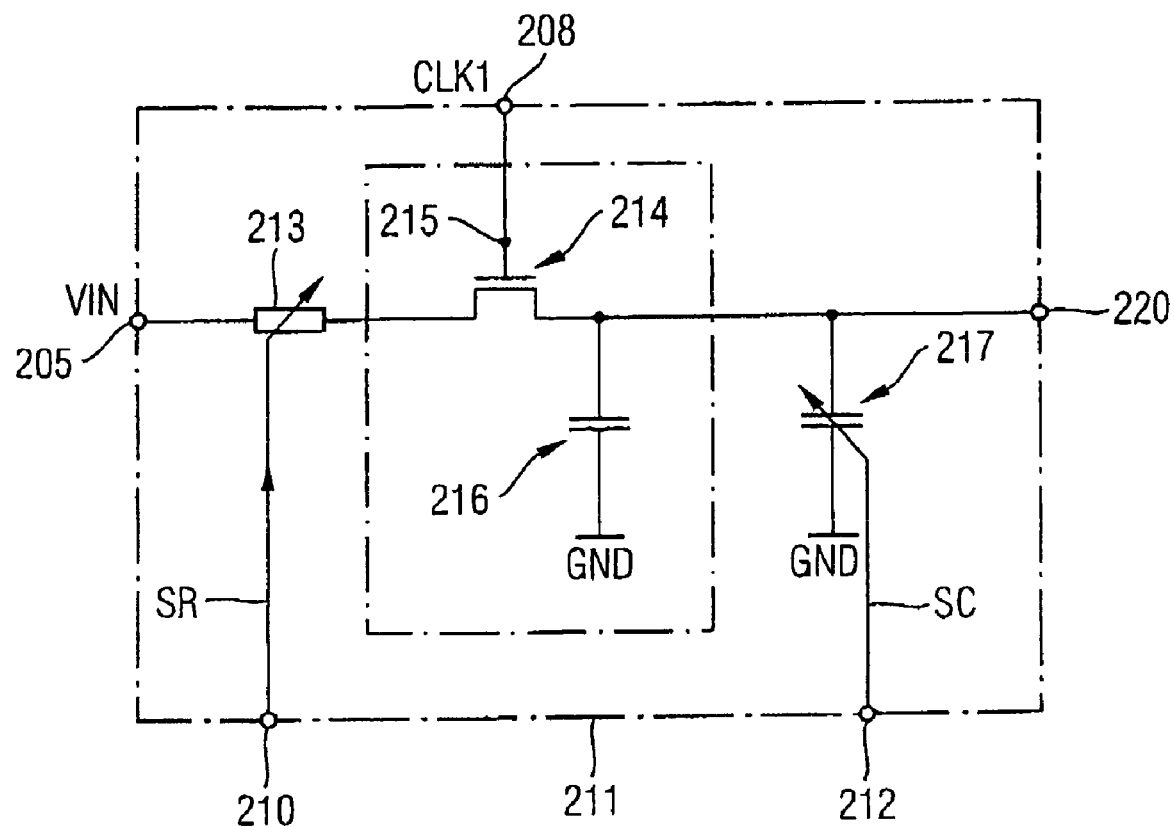
FIG. 4 shows a means for bandwidth setting in a signal path.

FIG. 4 shows a sample and hold element 211, the bandwidth of which can be set, having an input 205, an output 220, a switching terminal 208, a first control terminal 210 and a second control terminal 212. A variable resistor 213 and the controllable path of a transistor 214 are connected in series between the input 205 and the output 220. The transistor 214 furthermore has a gate terminal 215 coupled to the switching terminal 208. A capacitor 216 is connected between the output 220 and a first reference potential or ground GND. Furthermore, a variable capacitor 217 is connected between the output 220 and ground GND.

The resistance of the variable resistor 213 is controlled by a control signal SR applied to the first control input 210.

By way of example, according to the invention, a variable resistor can be realized by connecting a plurality of resistors in parallel, which can be connected into or out of the signal path by means of controllable switches.

The capacitance of the variable capacitor 217 is controlled by a second control signal SC applied to the second control input 212. The two control signals SR, SC are supplied for example by an adjustment device of the kind described in FIG. 3.

The transistor 214 and the capacitor 216 essentially form a simple sample and hold element, the bandwidth of which is fixed (box depicted by broken lines). The clock signal CLK1, for example, is applied to the switching terminal 208. If the clock signal CLK1 is at logic H level, the transistor 214 turns on, so that the input signal VIN or the input potential charges the capacitor 216 and the variable capacitor 217. The input signal VIN is then also present at the output 220 of the sample and hold element 211.

In the hold state of the sample and hold element 211, the clock signal CLK1 is at L level, as a result of which the transistor 214 acts as an open switch. The previously applied input signal VIN is then analogously stored by the capacitor 216 or the variable capacitor 217 and is ready for further processing at the output 220 of the sample and hold element 211.

A change in the bandwidth and thus a change in the phase response of said sample and hold element 211 are effected by means of a change in the resistance of the resistor 213 and/or a change in the capacitance of the variable capacitor 217.

According to the invention, a change in the bandwidth can furthermore be achieved by means of a change in the potential which corresponds to a logic H level of the clock signal CLK. Since the resistance of the controllable path of the transistor 214 depends on the potential present at the gate terminal 214, a change in the bandwidth is thus possible by changing the referencing of the H and L levels. A potential applied to the gate terminal 214 may be supplied by a digital-to-analog converter, for example, depending on a digital control signal.

Figure 5:
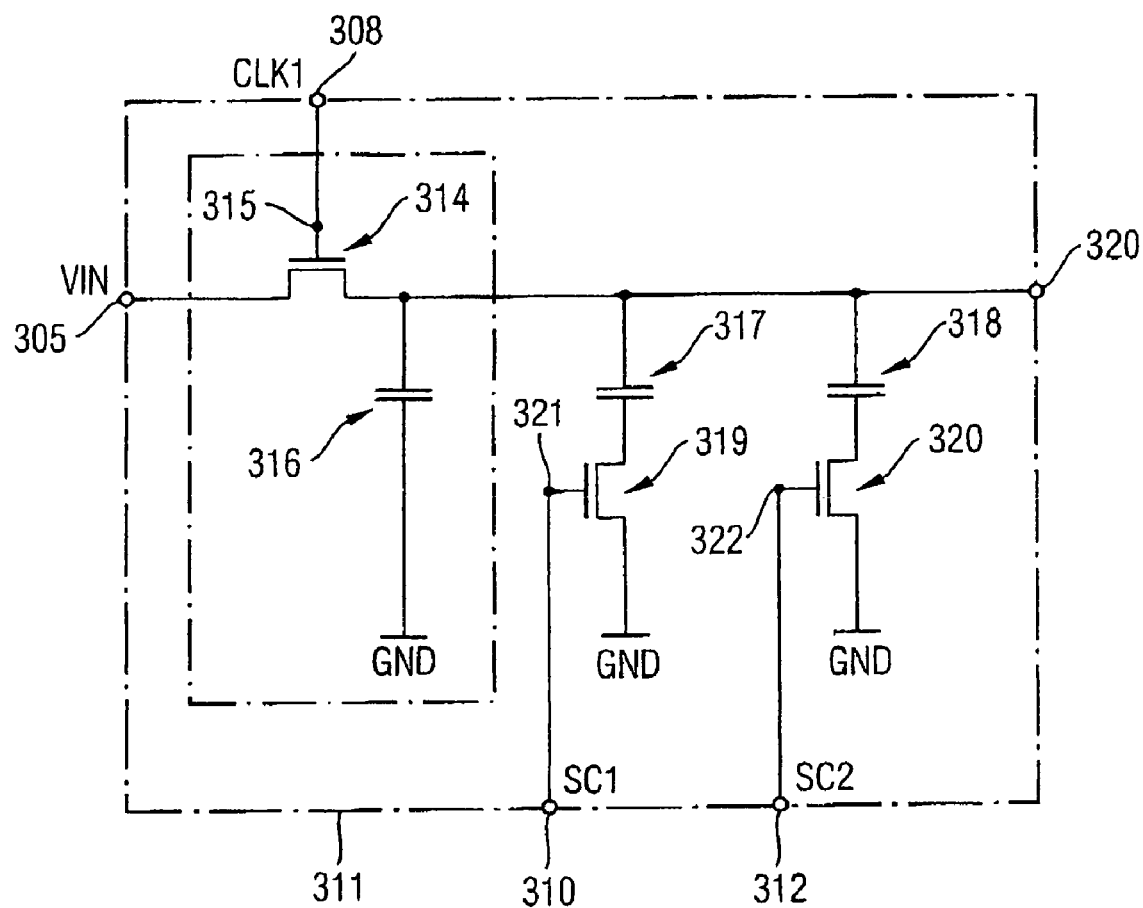
FIG. 5 shows a further means for bandwidth setting in the signal path.

FIG. 5 shows a further preferred embodiment of a sample and hold element 311, the bandwidth of which can be set. The bandwidth of the sample and hold element 311 is in this case produced by means of a variable capacitance realized in the form of capacitors 317, 318 that can be connected in.

The sample and hold element 311 has an input 305 and an output 320, between which the controllable path of a transistor 314 is connected, a gate terminal 315 of the transistor 314 being connected to a switching terminal 308, to which a clock signal CLK1, for example, is coupled in.

Furthermore, a capacitor 316 is provided, which is connected between the output 320 and a reference potential or ground GND. Two capacitors 317, 318 that can be connected in are provided, which are likewise connected between the output 320 and ground GND and can be connected in by means of switching transistors 319, 320, the controllable path of which is in each case connected between the respective capacitor 317, 318 and ground GND. The corresponding gate terminals 321, 322 are in each case connected to a control input 310, 312 of the sample and hold element 311.

Control signals SC1, SC2, which are supplied for example by an adjustment device 312 of the kind shown in FIG. 3, are in each case present at the control terminals 310, 312. Depending on these control signals SC1, SC2, the capacitors 317, 318 are connected in or disconnected with respect to the capacitor 316, as a result of which the total capacitance 316, 317, 318 changes and the phase response of the sample and hold element 311 can accordingly be set. This is accompanied by a corresponding alteration of the bandwidth of the sample and hold element 311, which is in turn equivalent to a certain time offset in the signal path, that is to say between input and output 305, 320.

Figure 6:
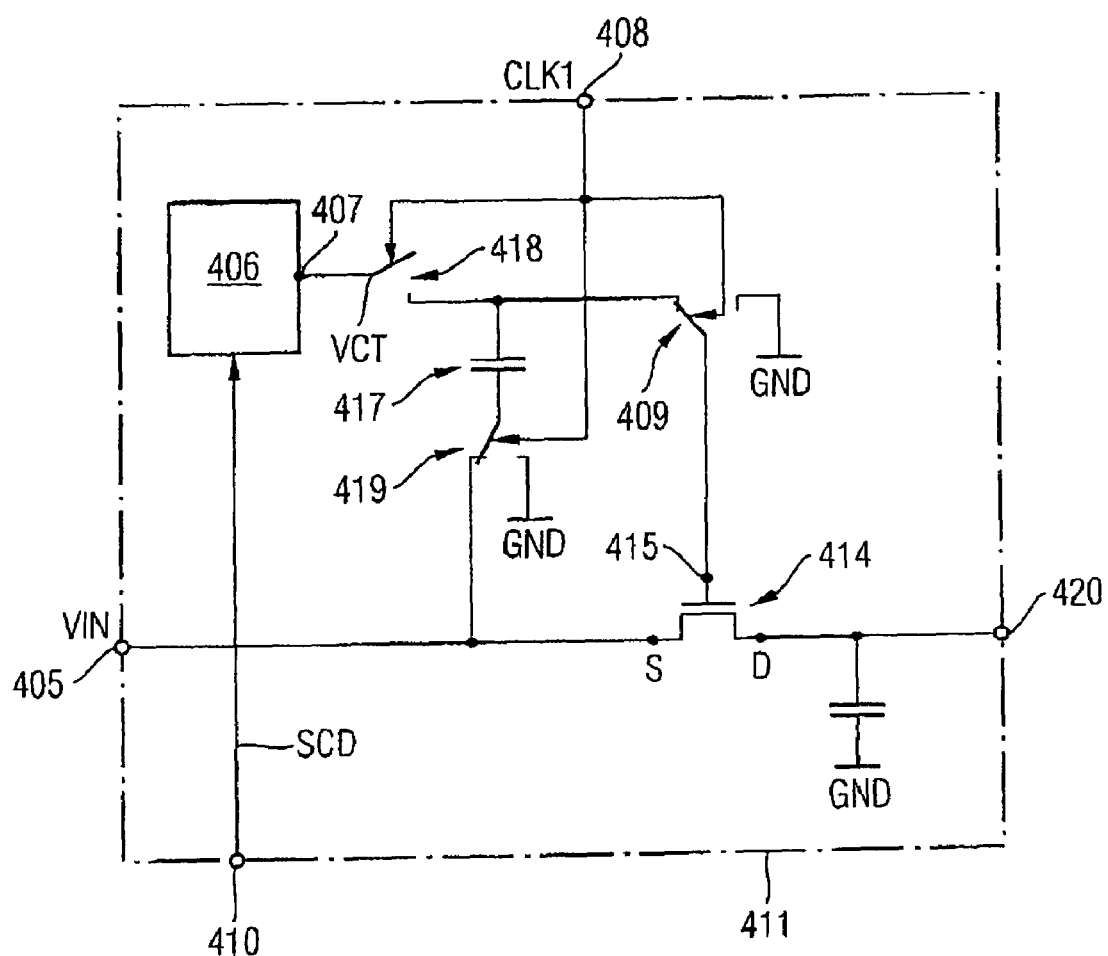
FIG. 6 shows a preferred embodiment of a means for bandwidth setting in the signal path.

FIG. 6 shows a further preferred embodiment of a sample and hold element 411, the bandwidth of which can be set. The sample and hold element 411 has an input 405, an output 420, one or more control inputs 410 and a switching input 408.

The controllable path of a transistor 414 is connected between the input 405, to which the analog input signal VIN is coupled in, and the output 420. The transistor has a source terminal S, drain terminal D and a gate terminal 415.

A first controllable switch 409 connects the gate terminal 415 of the transistor 414 either to ground GND or to a buffer capacitor 417, which is coupled between the first switch 409 and, via a third controllable switch 419, to the source terminal S of the transistor 414. The controllable switch 409 switches depending on a switching signal, which is a clock signal CLK1, for example, which is coupled into the switching input 408.

A control potential VCT is generated by a digital-to-analog converter 406, which is supplied with a digital control signal SCD, which is coupled in via the control input 410 and is supplied for example by an adjustment device of the kind described in FIG. 3. Consequently, the digital-to-analog converter 406 outputs the analog control potential VCT at its output 407 or a control potential terminal 407.

A second controllable switch 418, the buffer capacitor 417 and the third controllable switch 419 are provided, the controllable switches connecting the buffer capacitor 417 either between the control potential terminal 407 and the first reference potential GND or between the gate terminal 415 of the transistor 414 and the input 405 of the sample and hold element 411, depending on a control signal, which is the clock signal CLK1 in this exemplary embodiment.

The first, second and third controllable switches 409, 418, 419 are controlled in such a way that either ground GND is applied to the gate terminal 415 and the buffer capacitor 417 is simultaneously connected between the control potential VCT and ground GND, or that the control potential terminal 407 is disconnected from the capacitor 417 and the gate terminal 415 and the precharged buffer capacitor 417 is connected between the source terminal S and the gate terminal 415 of the transistor 414. In the latter case, the precharge voltage VCT-GND is then present between the gate and source terminals 415, S of the transistor 415 and determines the resistance of the controllable path S, D.

Since the resistance of the controllable path of the transistor 414 depends on the applied potential at its gate terminal 415 or the potential difference between source and gate terminals S, 415, a change in the control potential VCT produces a change in the resistance, thereby in turn altering the bandwidth of the sample and hold element 411.

Figure 7:
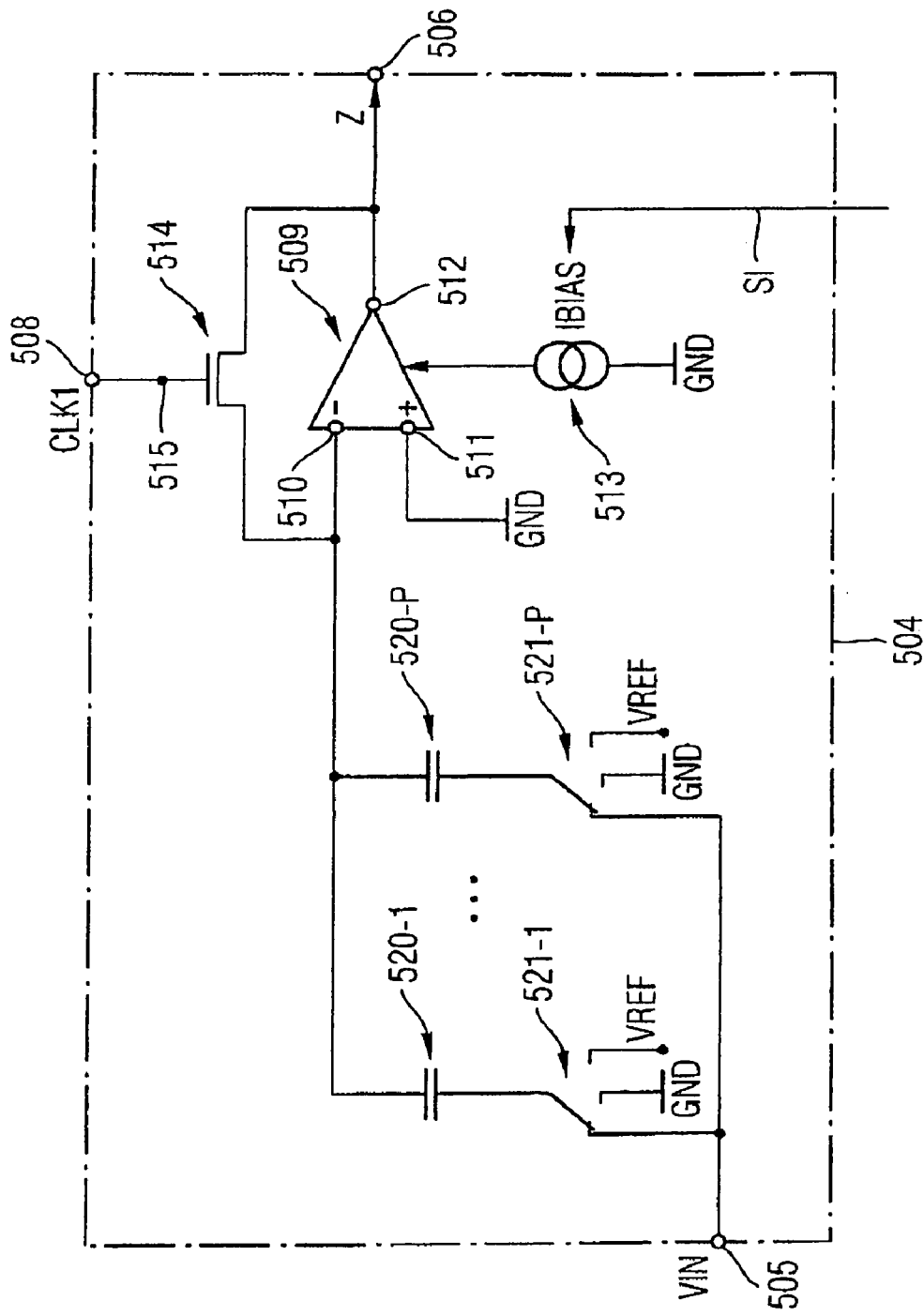
FIG. 7 shows a preferred embodiment of an analog-to-digital converter for a converter array according to the invention.

FIG. 7 shows a preferred embodiment of an analog-to-digital converter 504 which operates according to the charge redistribution method. Analog-to-digital converters of this generic type may advantageously be used in converter arrays since they operate in a manner that is particularly effective at saving power and their phase response or the bandwidth can easily be set. Although their sampling frequency is lower compared with other converter architectures, this is not disadvantageous in the case of use in TIADCs or converter arrays.

An analog-to-digital converter according to the charge redistribution method essentially has an input 505 for coupling in the analog input signal VIN, an output 506, at which a digital output signal Z can be tapped off, and a clock input 508 for application of a clock signal, for example CLK1.

The corresponding analog-to-digital converter 504 essentially furthermore has a comparator 509, having an inverting input 510 and a noninverting input 511 and an output 512. The comparator 509 is generally embodied as an inverting amplifier exhibiting feedback via a switch. The switch provided is a transistor 514, the controllable path of which is connected between the output 512 and the inverting input 510 of the comparator or amplifier 509. The gate terminal 515 of the transistor 514 is coupled to the clock input 508 of the analog-to-digital converter 504.

Furthermore, the amplifier 509 is supplied with a bias current IBIAS by a controllable current source 513. The bias current for the amplifier 509 is set depending on a control signal SI supplied for example by an adjustment device of the kind described in FIG. 3.

Furthermore, a plurality of binary weighted capacitors 520-1 . . . 520-P are provided at the inverting input 510 of the comparator or amplifier 509, which capacitors are in each case connected via controllable switches either to the input 505 of the analog-to-digital converter 504, to a first reference potential or ground GND, or to a second reference potential VREF.

A detailed description of the conversion method is described for example in "All-MOS Charge Redistribution Analog-to-Digital Conversion Techniques—Part I" IEEE Journal of solid-state circuits, vol. sc.-10, No. 6 (1976).

Essentially, in a sampling phase, the binary weighted capacitors 520-1, . . . 520-P are connected to the analog input signal VIN and correspondingly charged, the transistor 514 turning on. An equilibrium state is established by means of the feedback amplifier 509. This state is maintained in an optional hold phase, in which the capacitors are connected to ground GND and the transistor 514 turns off.

In the charge redistribution phase or converter phase, the binary weighted capacitors 520-1, . . . 520-P are successively connected to a reference potential VREF via the switches 521-1, . . . 521-P and the comparison result Z of the comparator or amplifier is registered. The individual bits assigned to the respective capacitors are thus determined successively and can be tapped off at the output 506. An SAR logic (SAR=successive approximation register)—not illustrated here—stores the comparison results as respective bits of the digital conversion result and outputs corresponding digital intermediate signals Z1, . . . ZN.

The variation of the bandwidth of the analog-to-digital converter 504 may be effected, on the one hand, by changing the resistance of the controllable path of the transistor 514. The resistance may be effected for example in the manner realized in FIG. 6 on the basis of the transistor 414 described there.

The bandwidth is furthermore dependent on the dynamic response of the amplifier or comparator 509. By changing the bias current IBIAS, the transconductance of the comparator stage and thus the bandwidth thereof are altered. When using a corresponding analog-to-digital converter 504 which operates according to the charge redistribution method, a simple change in the bandwidth properties thereof is possible. Consequently, by changing the bandwidth, the phase response is altered and a deviation in the time offset of the respective clock signal for the analog-to-digital converter can therefore also be compensated for in a simple manner according to the invention.

A typical analog-to-digital converter which operates according to the charge redistribution method is mentioned above. Modifications are also possible, of course. By way of example, the amplifier may be replaced by an inverter which is likewise supplied with a bias current and exhibits feedback via a switch in the sampling phase.

A fully differential embodiment of the converter according to the charge redistribution method is also conceivable. A second plurality of binary weighted capacitors 520-1, . . . 520-P are then provided at the differential amplifier 509 and are connected to the noninverting input 511 instead of the ground potential GND. A differential signal to be converted is then applied to the first plurality and second plurality of binary weighted capacitors in the sampling phase. The bandwidth can then also be set easily according to the invention by means of a bias current and/or a resistance of the feedback loop.

Furthermore, it is also possible to use a comparator having only one input and a predetermined switching threshold.

Although the present invention has been described above on the basis of preferred exemplary embodiments, it is not restricted thereto, but rather can be modified in diverse ways.

The present invention shall not be restricted to the specific construction of the sample and hold elements, which rather show the respective basic construction and can be modified in diverse ways.

Although the invention has been explained on the basis of non-differential signal paths, it is also possible, of course, to choose differential designs without departing from the fundamental principle of the invention. In addition to the exemplary embodiments described above, the bandwidth of signal paths can then be attained for example also be connecting capacitors between two signal-carrying lines which carry the corresponding differential signal.

Although the logic circuit for the interconnection of the digital intermediate signals Z1, . . . ZN for the purpose of generating the digital output signal ZD is represented as a multiplexer in the exemplary embodiments, alternative realizations are possible. In particular, a logic circuit may perform a preprocessing of the digital intermediate signals in order, by way of example, to reduce the data density in the individual channels of the converter array. Buffer-storage of the digital intermediate signals Z1, . . . ZN and software combination of the intermediate signals Z1, . . . ZN to form the digital output signal ZD are also possible.

Furthermore, converter arrays utilizing the invention are possible in which a plurality of signal-processing stages are provided between the formation of the output signal ZD by the logic circuit, which is embodied as multiplexer 7, for example, and the input-side branching of the analog input signal between parallel converter channels. Digital signal processors for preprocessing the intermediate signals or memory devices for buffer-storage shall be mentioned as an example.

The essential basic concept of the present invention resides in utilizing existing filters in the signal paths of analog-to-digital converter channels in TIADCs in order, by changing the bandwidth thereof, to compensate for a time offset of the clock signals of the corresponding analog-to-digital converters.

The present invention has the major advantage of compensating for deviations from the predetermined optimum time offset of the clock signals in the signal path itself. There is no need for any additional setting mechanisms, for example delay elements for the individual clock signals which are passed to the analog-to-digital converters. As a result, a circuit arrangement according to the invention is very effective at saving power and yields precise conversion results.

| List of reference symbols | |
|---|---|
| 1 | Circuit arrangement |
| 2 | Input |
| 3 | Output |
| 4-1–4-N | Analog-to-digital converter |
| 5-1–5-N | Analog input |
| 6-1–6-N | Digital output |
| 7 | Multiplexer |
| 8-1–8-N | Clock input |
| 9 | |
| 10 | Clock generator |
| 105-1–105-N | Input |
| 108-1–108-N | Clock input |
| 110-1–110-N | Control input |
| 11-1–11-N | Sample and hold element |
| 12 | Adjustment device |
| 13 | Input |
| 14 | Output |
| 15 | Changeover device |
| 205 | Input |
| 208 | Switching input |
| 210 | Control input |
| 211 | Sample and hold element |
| 212 | Control input |
| 213 | Variable resistor |
| 214 | Transistor |
| 215 | Gate terminal |
| 216 | Capacitor |
| 217 | Variable capacitor |
| 220 | Output |
| 305 | Input |
| 308 | Switching input |
| 310 | Control input |
| 311 | Sample and hold element |
| 312 | Control input |
| 314 | Transistor |
| 315 | Gate terminal |
| 316 | Capacitor |
| 317 | Capacitor |
| 318 | Capacitor |
| 319 | Transistor |
| 320 | Output |
| 320 | Transistor |
| 321 | Gate terminal |
| 322 | Gate terminal |
| 405 | Input |
| 406 | Digital-to-analog converter |
| 407 | Control potential terminal |
| 408 | Switching input |
| 409 | Controllable switch |
| 410 | Control input |
| 411 | Sample and hold element |
| 414 | Transistor |
| 415 | Gate terminal |
| 416 | Capacitor |

-continued

| List of reference symbols | |
|---|---|
| 417 | Capacitor |
| 418 | Controllable switch |
| 419 | Controllable switch |
| 420 | Output |
| 504 | Analog-to-digital converter |
| 505 | Input |
| 506 | Output |
| 508 | Clock input |
| 509 | Comparator |
| 510 | Inverting input |
| 511 | Noninverting input |
| 512 | Output |
| 513 | Controllable current source |
| 514 | Transistor |
| 514 | Transistor |
| 515 | Gate terminal |
| 515 | Gate terminal |
| 520-1–520-P | Binary weight of the capacitors |
| 521-1–521-P | Controllable switch |
| | Delay locked loop |
| A/D1–A/Dn | Analog-to-digital converter |
| A1–AN | Output |
| C1–CN | Clock input |
| CLK | Global clock signal |
| CLK1'–CLKN' | Tuned clock signal |
| CLK1–CLKN | Clock signal |
| CLKG | Clock generator |
| DLL | Delay locked loop |
| E1–EN | Analog input |
| GND | Ground |
| S | Source terminal |
| D | Drain terminal |
| IBIAS | Bias current |
| MUX | Multiplexer |
| S1 | Control signal |
| SC | Control signal |
| SC1, SC2 | Control signal |
| SCD | Digital control word |
| SR | Control signal |
| SVT | Test control signal |
| TIADC | Converter array |
| V1–VN | Tunable delay element |
| VCT | Control potential |
| VIN | Input signal |
| VREF | Reference potential |
| VT | Test signal |
| Z1–ZN | Intermediate signal |
| ZD | Digital output signal |

What is claimed is:

1. A circuit arrangement for delay adjustment of analog-to-digital converters operating in a temporally offset manner, having:

(a) at least two analog-to-digital converters each having a signal path, which receive an analog signal present at an input of the circuit arrangement and convert it into a digital intermediate signal, each of the analog-to-digital converters being clocked by a respective clock signal, the clock signals having a predetermined time offset with respect to one another;

(b) a logic circuit, which interconnects the digital intermediate signals for the purpose of generating a digital output signal of the circuit arrangement;

(c) means for bandwidth setting having an input and an output for changing the bandwidth of the signal paths of the analog-to-digital converters; and (d) an adjustment device, which has an output connected to the input of the circuit arrangement, and an input connected to the output of the circuit arrangement, and supplies control signals to the means for changing the bandwidth in such a way that by changing the bandwidth of at least one signal path a deviation of the clock signal from the predetermined time offset for the respective analog-to-digital converter is compensated for.

2. The circuit arrangement as claimed in claim 1, wherein the logic circuit has a multiplexer, which successively switches through the digital intermediate signals for the purpose of generating the digital output signal.

3. The circuit arrangement as claimed in claim 1, wherein at least one means for bandwidth setting has a transistor having a controllable path and a gate terminal, the controllable path being connected to the input of the means in the signal path and having a resistance depending on a control potential applied to the gate terminal.

4. The circuit arrangement as claimed in claim 1, wherein at least one means for bandwidth setting has a sample and hold element.

5. The circuit arrangement as claimed in claim 1, wherein at least one means for bandwidth setting has a filter.

6. The circuit arrangement as claimed in claim 1, wherein at least one means for bandwidth setting has a variable resistor, which is connected to the input of the means in the signal path.

7. The circuit arrangement as claimed in claim 1, wherein at least one means for bandwidth setting has a variable capacitor, which is connected between the output of the means and a first reference potential.

8. The circuit arrangement as claimed in claim 7, wherein at least one means for bandwidth setting has further switchable capacitors that can be additionally connected between the output of the means and the first reference potential.

9. The circuit arrangement as claimed in claim 1, wherein at least one analog-to-digital converter operates according to the charge redistribution method and has
(a) a comparator, which is supplied with a bias current from a bias current source, the comparator having at least one input and an output;
(b) a plurality of binary weighted capacitors, which are connected in parallel between the input of the comparator and a respective controllable switch, the controllable switches switching the analog input signal, a first reference potential or a second reference potential to the respective capacitor; and
(c) a transistor having a gate terminal and a controllable path that has a resistance value, the gate terminal being coupled to a switching signal and the controllable path being connected between the input and the output of the comparator;
wherein the bandwidth of the analog-to-digital-converter is adjustable by varying the bias current.

10. The circuit arrangement as claimed in claim 9, wherein at least one switch is provided between the gate terminal of the transistor and the switching potential, which switch switches either the switching potential or a control potential to the gate terminal depending on a control signal.

11. The circuit arrangement as claimed in claim 10, wherein the control potential is supplied by a digital-to-analog converter depending on a digital control signal and can be tapped off at a control potential terminal.

12. The circuit arrangement as claimed in claim 11, wherein a second controllable switch, a buffer capacitor and a third controllable switch are provided between the control potential and the first reference potential, the controllable switches connecting the buffer capacitor either between the control potential terminal and the first reference potential or between the gate terminal of the transistor and the input of the means for bandwidth setting, depending on a control signal.

13. A method for delay adjustment of analog-to-digital converters operating in a temporally offset manner, having the method steps:
(a) providing at least two analog-to-digital converters each having a signal path, which receive an analog signal and convert it into a digital intermediate signal, each of said analog-to-digital converters being clocked by a respective clock signal, the clock signals having a predetermined time offset with respect to one another;
(b) interconnecting the digital intermediate signals by use of a logic circuit for the purpose of generating a digital output signal; and
(c) changing a bandwidth of at least one of the signal paths of the analog-to-digital converters in such a way that a deviation of the clock signal from the predetermined time offset for the respective analog-to-digital converter is compensated for.

14. The method as claimed in claim 13, wherein a pilot test signal is mixed into the analog input signal, the pilot test signal lying in a frequency range where no parts of the analog input signal to be converted is present.

15. The method as claimed in claim 13, wherein changing the bandwidth is achieved by changing a phase response of a sample-and-hold element.

16. The method as claimed in claim 13, wherein the further method steps are performed:
(a) switching an analog sinusoidal test signal as an analog input signal, the analog sinusoidal test signal having a frequency component;
(b) performing a Fourier analysis on the digital output signal; and
(c) setting the bandwidth in such a way that only the frequency component of the analog sinusoidal test signal contributes to the digital output signal.

17. A circuit arrangement for the delay adjustment of analog-to-digital converters operating in a temporally offset manner, having:
(a) at least two analog-to-digital converters each having a signal path, which receive an analog signal present at an input of the circuit arrangement and in each case convert it into a digital intermediate signal, the analog-to-digital converters in each case being clocked by clock signals which have a predetermined time offset with respect to one another;
(b) a logic circuit, which interconnects the digital intermediate signals for the purpose of generating a digital output signal of the circuit arrangement;
it being possible to set the bandwidth of the signal paths of the analog-to-digital converters in each case in such a way that a deviation of the clock signal from the predetermined time offset for the respective analog-to-digital converter is compensated for by a change in the bandwidth of at least one signal path, wherein a second controllable switch, a buffer capacitor and a third controllable switch are provided between the control potential and the first reference potential, the controllable switches connecting the buffer capacitor either between the control potential terminal and the first reference potential or between the gate terminal of the transistor and the input of the means for bandwidth setting, depending on a control signal.

18. A circuit arrangement for the delay adjustment of analog-to-digital converters operating in a temporally offset manner, having:

(a) at least two analog-to-digital converters each having a signal path, which receive an analog signal present at an input of the circuit arrangement and in each case convert it into a digital intermediate signal, the analog-to-digital converters in each case being clocked by clock signals which have a predetermined time offset with respect to one another;

(b) a logic circuit, which interconnects the digital intermediate signals for the purpose of generating a digital output signal of the circuit arrangement;

it being possible to set the bandwidth of the signal paths of the analog-to-digital converters in each case in such a way that a deviation of the clock signal from the predetermined time offset for the respective analog-to-digital converter is compensated for by a change in the bandwidth of at least one signal path, wherein at least one switch is provided between the gate terminal of the transistor and the switching potential, which switch switches either the switching potential or a control potential to the gate terminal depending on a control signal.

19. A circuit arrangement for the delay adjustment of analog-to-digital converters operating in a temporally offset manner, having:

(a) at least two analog-to-digital converters each having a signal path, which receive an analog signal present at an input of the circuit arrangement and in each case convert it into a digital intermediate signal, the analog-to-digital converters in each case being clocked by clock signals which have a predetermined time offset with respect to one another;

(b) a logic circuit, which interconnects the digital intermediate signals for the purpose of generating a digital output signal of the circuit arrangement;

it being possible to set the bandwidth of the signal paths of the analog-to-digital converters in each case in such a way that a deviation of the clock signal from the predetermined time offset for the respective analog-to-digital converter is compensated for by a change in the bandwidth of at least one signal path, wherein at least one means for bandwidth setting has a transistor having a controllable path and a gate terminal, the controllable path being connected to the input of the means in the signal path and having a resistance depending on a control potential applied to the gate terminal.

20. A circuit arrangement for the delay adjustment of analog-to-digital converters operating in a temporally offset manner, having:

(a) at least two analog-to-digital converters each having a signal path, which receive an analog signal present at an input of the circuit arrangement and in each case convert it into a digital intermediate signal, the analog-to-digital converters in each case being clocked by clock signals which have a predetermined time offset with respect to one another, and wherein at least one analog-to-digital converter operates according to the charge redistribution method and has:

(i) a comparator, which is supplied with a bias current from a bias current source, the comparator having at least one input and an output;

(ii) a plurality of binary weighted capacitors, which are connected in parallel between the input of the comparator and a respective controllable switch, the controllable switches switching the analog input signal, a first reference potential or a second reference potential to the respective capacitor; and (iii) a transistor having a gate terminal and a controllable path that has a resistance value, the gate terminal being coupled to a switching signal and the controllable path being connected between the input and the output of the comparator;

wherein the bandwidth of the analog-to-digital-converter is adjustable by varying the bias current; and (b) a logic circuit, which interconnects the digital intermediate signals for the purpose of generating a digital output signal of the circuit arrangement;

it being possible to set the bandwidth of the signal paths of the analog-to-digital converters in each case in such a way that a deviation of the clock signal from the predetermined time offset for the respective analog-to-digital converter is compensated for by a change in the bandwidth of at least one signal path.

* * * * *